US010348017B2

(12) United States Patent
Bednarek

(10) Patent No.: US 10,348,017 B2
(45) Date of Patent: Jul. 9, 2019

(54) COATING PROCESS AND COATING FOR PRESS-FIT CONTACT

(71) Applicant: Tyco Electronics France SAS, Pointoise (FR)

(72) Inventor: Alain Bednarek, Neilly en Vexin (FR)

(73) Assignee: Tyco Electronics France SAS, Pontoise (FR)

( * ) Notice: Subject to any disclaimer, the term of this patent is extended or adjusted under 35 U.S.C. 154(b) by 251 days.

(21) Appl. No.: 14/600,584

(22) Filed: Jan. 20, 2015

(65) Prior Publication Data

US 2015/0136456 A1  May 21, 2015

Related U.S. Application Data

(63) Continuation of application No. PCT/EP2013/065286, filed on Jul. 19, 2013.

(30) Foreign Application Priority Data

Jul. 20, 2012  (FR) ...................... 1257093

(51) Int. Cl.
*H01R 12/58*  (2011.01)
*H01R 13/03*  (2006.01)
(Continued)

(52) U.S. Cl.
CPC ............ *H01R 13/03* (2013.01); *B32B 15/01* (2013.01); *B32B 15/013* (2013.01); *C22C 13/00* (2013.01);
(Continued)

(58) Field of Classification Search
CPC .......... H05K 1/00; H01K 5/02; H01K 1/0271; H01R 43/00; H01R 12/585

USPC ..... 428/646; 427/255.34; 174/261, 260, 255
See application file for complete search history.

(56) References Cited

U.S. PATENT DOCUMENTS

| 5,916,695 A | 6/1999 | Fister et al. |
| 6,083,633 A * | 7/2000 | Fister ...................... B32B 15/01 428/615 |
| 6,183,886 B1 * | 2/2001 | Chen ....................... C23C 28/00 148/537 |
| 6,596,621 B1 | 7/2003 | Copeland et al. |

(Continued)

FOREIGN PATENT DOCUMENTS

| DE | 102010042526 A1 | 4/2012 |
| WO | 2006134665 A1 | 12/2006 |

OTHER PUBLICATIONS

Translation of the First Office Action, Chinese Patent Application No. 2013800375631, dated Jan. 12, 2016, 11 pages.

(Continued)

*Primary Examiner* — Tabassom Tadayyon Eslami
(74) *Attorney, Agent, or Firm* — Barley Snyder

(57) ABSTRACT

A process is disclosed for coating a substrate. The process includes providing a substrate having at least one free surface; depositing a first layer of a first material on the free surface of the substrate; depositing a second layer of a second material, different from the first material, on the first layer; depositing a third layer of a third material, different from the first and second materials, on the second layer; depositing a protective layer of a fourth material, different from the first, second and third materials, on the third layer; and performing a reflow of at least the second and third layers from the first, second, and third layers, by transfer of heat through the thermal contact on the protective layer, such that the protective layer prevents oxidation of at least the third layer.

25 Claims, 3 Drawing Sheets

(51) Int. Cl.
  *B32B 15/01*   (2006.01)
  *C22C 13/00*   (2006.01)
  *C22C 18/00*   (2006.01)
  *H05K 3/00*    (2006.01)
  *H05K 3/46*    (2006.01)
  *C23C 28/00*   (2006.01)

(52) U.S. Cl.
  CPC ............ *C22C 18/00* (2013.01); *C23C 28/322* (2013.01); *C23C 28/343* (2013.01); *H01R 12/585* (2013.01); *H05K 3/0091* (2013.01); *H05K 3/46* (2013.01); *Y10T 428/12792* (2015.01)

(56) References Cited

U.S. PATENT DOCUMENTS

| | | |
|---|---|---|
| 7,984,841 B2 | 7/2011 | Sakuyama |
| 2010/0311288 A1 | 12/2010 | Horn et al. |
| 2011/0097597 A1* | 4/2011 | Yau .................. C23C 18/54 428/647 |
| 2012/0320545 A1* | 12/2012 | Lo Presti .............. H05K 1/145 361/752 |
| 2013/0330572 A1 | 12/2013 | Staschko et al. |

OTHER PUBLICATIONS

PCT Notification Concerning Transmittal of Copy of International Preliminary Report on Patentability, 1 page.
PCT International Preliminary Report on Patentability, International Application No. PCT/EP2013/065286, dated Jan. 20, 2015, 7 pages.

* cited by examiner

COATING PROCESS AND COATING FOR PRESS-FIT CONTACT

CROSS-REFERENCE TO RELATED APPLICATIONS

This application is a continuation of PCT International Application No. PCT/EP2013/065286, filed Jul. 19, 2013, which claims priority under 35 U.S.C. § 119 to French Patent Application 1257093; filed Jul. 20, 2012.

FIELD OF THE INVENTION

The present invention generally relates to a process for preventing the formation of filaments on the surface of metallic layers, and more specifically, a process for preventing the formation of filaments on the surface of metallic layers used for the plating of press-fit contacts.

BACKGROUND

The formation of filaments or whiskers, particularly from the surface of a pure metal, is a known phenomenon which can have consequences in the production of short-circuits or the initiation of electrical arcs at the surface of the metallic layers used for the plating of contacts of electronic components. The pure metal may be for example, tin, zinc, cadmium, indium, antimony, silver or gold, as opposed to an alloy composed of at least one metal and another element.

Certain factors such as mechanical or chemical stresses, scratches, diffusion of different materials, or thermal expansion increase the risk of filament formation. Contrary to dendrites, another phenomenon appearing at the surface of certain metals, the dissolution of the metal or the presence of electromagnetic fields does not have an effect on the formation or the growth of the filaments.

The contacts of electronic components are generally composed of a base substrate such as copper, plated with a metallic coating, of which pure tin (as opposed to a tin alloy) is most frequently used. This is particularly common for contacts, especially for press-fit contacts. When the contacts made of copper plated with pure tin, in addition to the stresses inherent in the coating layer or in the substrate itself, compression stresses in the plating often lead to the formation of filaments due to the diffusion of copper atoms from the substrate along the boundaries of the grains of the tin film. The filaments are often formed of an intermetallic compound ("IMC"), $Cu_6Sn_5$. Under such stresses, the tin filaments can be formed from grains, the orientation of which differs from the major orientation of the tin film or from the orientation of the adjacent grains.

Conventionally, tin filament formation is reduced through the use of platings made of alloys of tin and lead. However, since lead is currently banned for the majority of electronic applications, particularly in the European Union, incidents due to the formation of filaments in the electronic components have again become common. Therefore, there is a need to find novel solutions for the prevention of the formation of the filaments, particularly on the contacts of electronic elements.

One approach to the problem of the tin filaments formed on elements of press-fit contacts is disclosed in European Patent Application No. EP 2 195 885 B1, which discloses a process for manufacture of an electrical contact element using a layer forming a diffusion barrier applied on a base material, on which is then applied a plurality of a combination of at least two metallic layers formed of different metals and at least one of which is made of tin. The layer forming the diffusion barrier prevents mixture between the base material and the layers of the combination of metallic layers, which are then subjected to a thermal treatment, the temperature of which must not exceed the melting temperature of the tin, i.e. 232° C. By controlling the temperature, the elements of the combination of metallic layers mix by diffusion, with the outer layer being an alloy comprising at least two different metals.

Another approach is detailed in WO 2006/134665 A1, which discloses the use of a nickel sub-layer between the copper-based substrate and the tin plating film. The nickel sub-layer reduces the stresses applied to the layer of tin by the intermetallic compound $Cu_6Sn_5$ by creating a denser intermetallic compound $Ni_3Sn_4$. A thermal treatment not exceeding 0.65 to 0.8 times the melting temperature of the grains can be applied in order to reduce the internal stresses of the coating.

These approaches offer somewhat of a reduction in the formation of the tin filaments, the approaches are difficult to implement and the production of coatings is not financially viable due to the duration and cost of the processes used. Due to the stresses and therefore to the permanent stresses applied to the ends of the press-fit contact pins by the printed circuit boards and deformations and displacements of the coating itself, these solutions are insufficient to avoid the formation of filaments in the case of press-fit contacts.

SUMMARY

A process for coating a substrate includes providing a substrate having at least one free surface; depositing a first layer of a first material on the free surface of the substrate; depositing a second layer of a second material, different from the first material, on the first layer; depositing a third layer of a third material, different from the first and second materials, on the second layer; depositing a protective layer of a fourth material, different from the first, second and third materials, on the third layer; and performing a reflow of at least the second and third layers from the first, second, and third layers, by transfer of heat through the thermal contact on the protective layer, such that the protective layer prevents oxidation of at least the third layer.

BRIEF DESCRIPTION OF THE DRAWINGS

The invention will now be described by example, by reference to the accompanying Figures, of which.

DETAILED DESCRIPTION OF THE EMBODIMENT(S)

Figure 1:
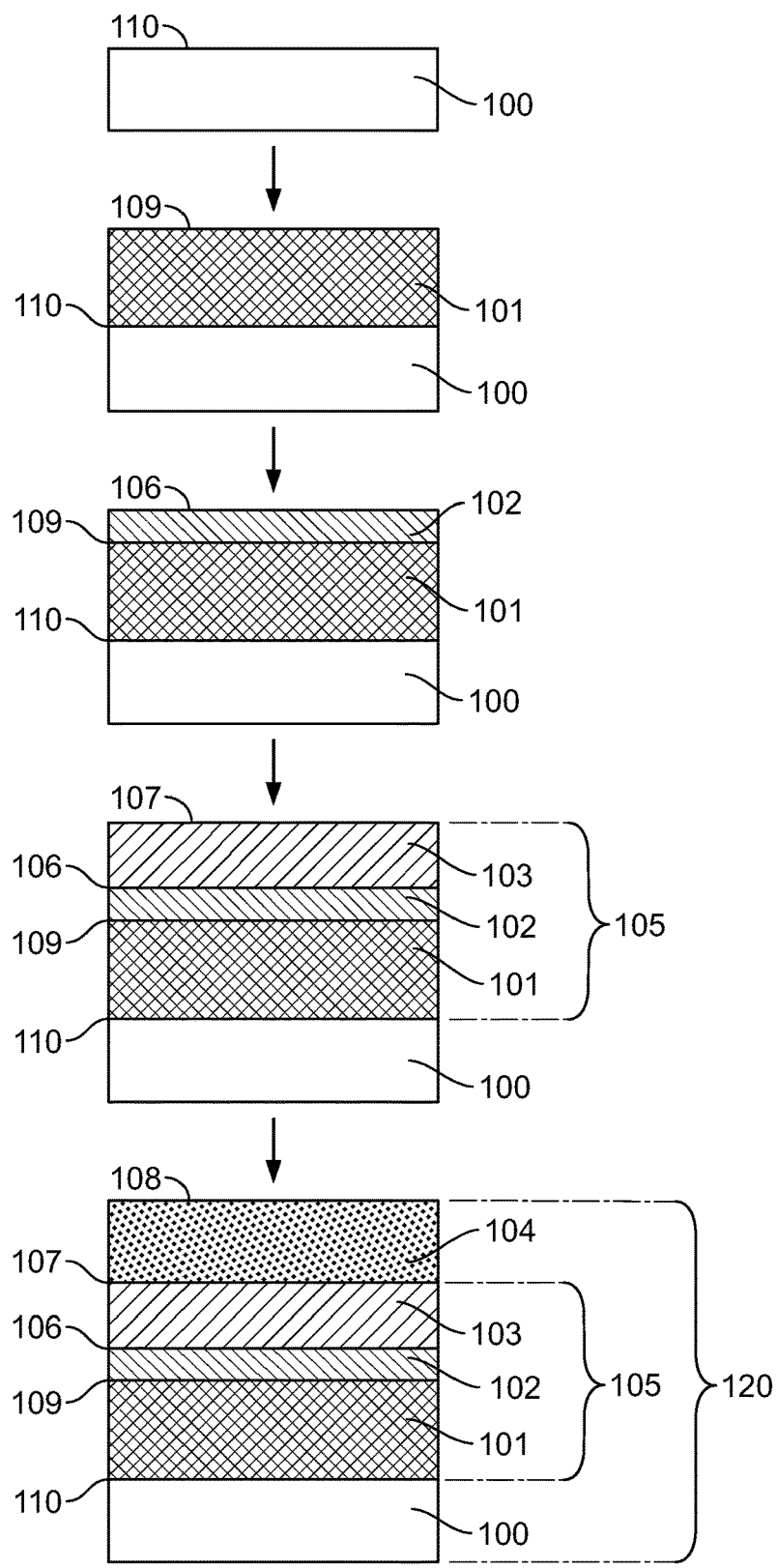
FIG. 1 showing a first example of an embodiment of the invention.
Figure 2:
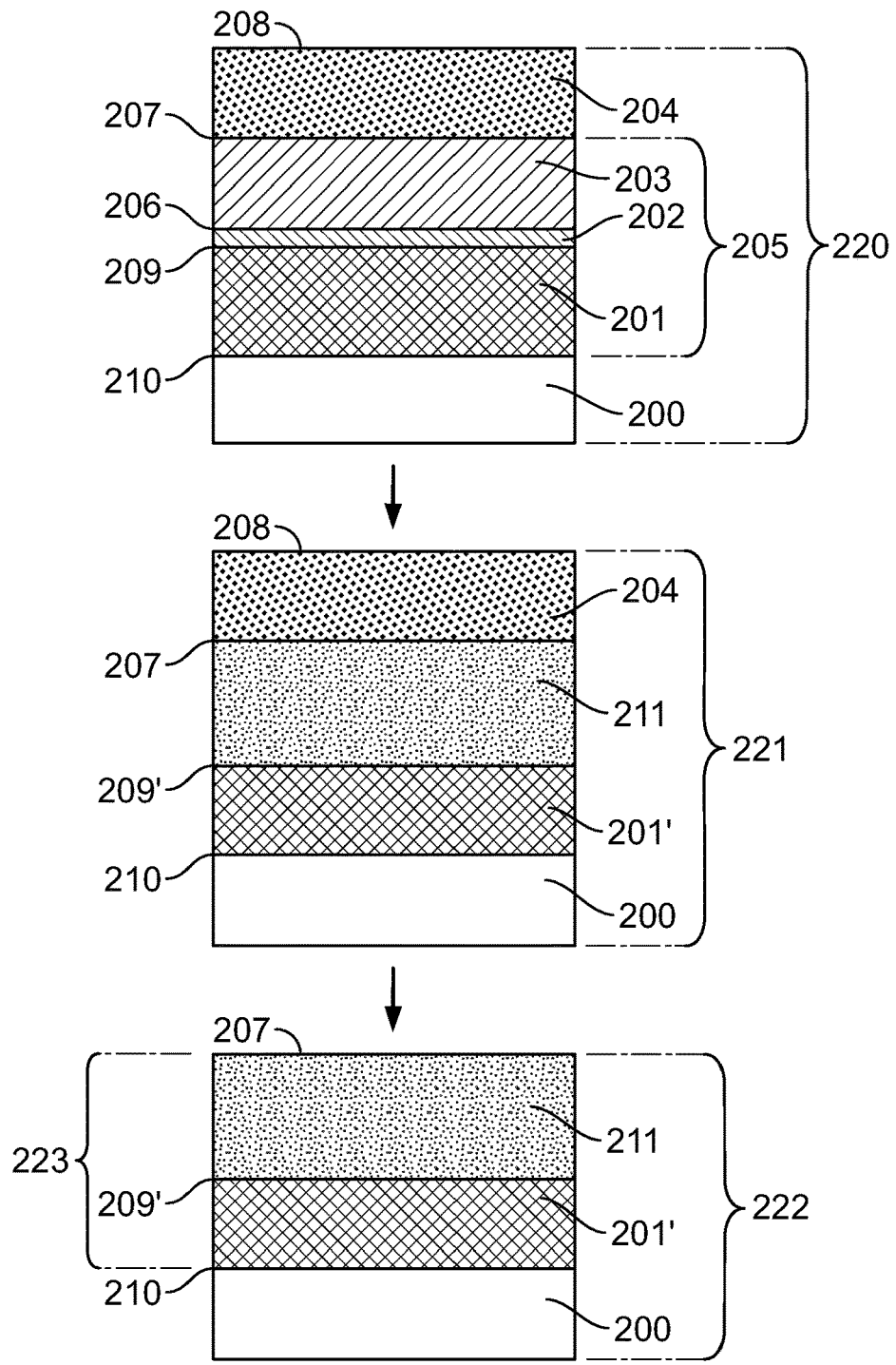
FIG. 2 showing a second example of an embodiment of the invention.
Figure 3:
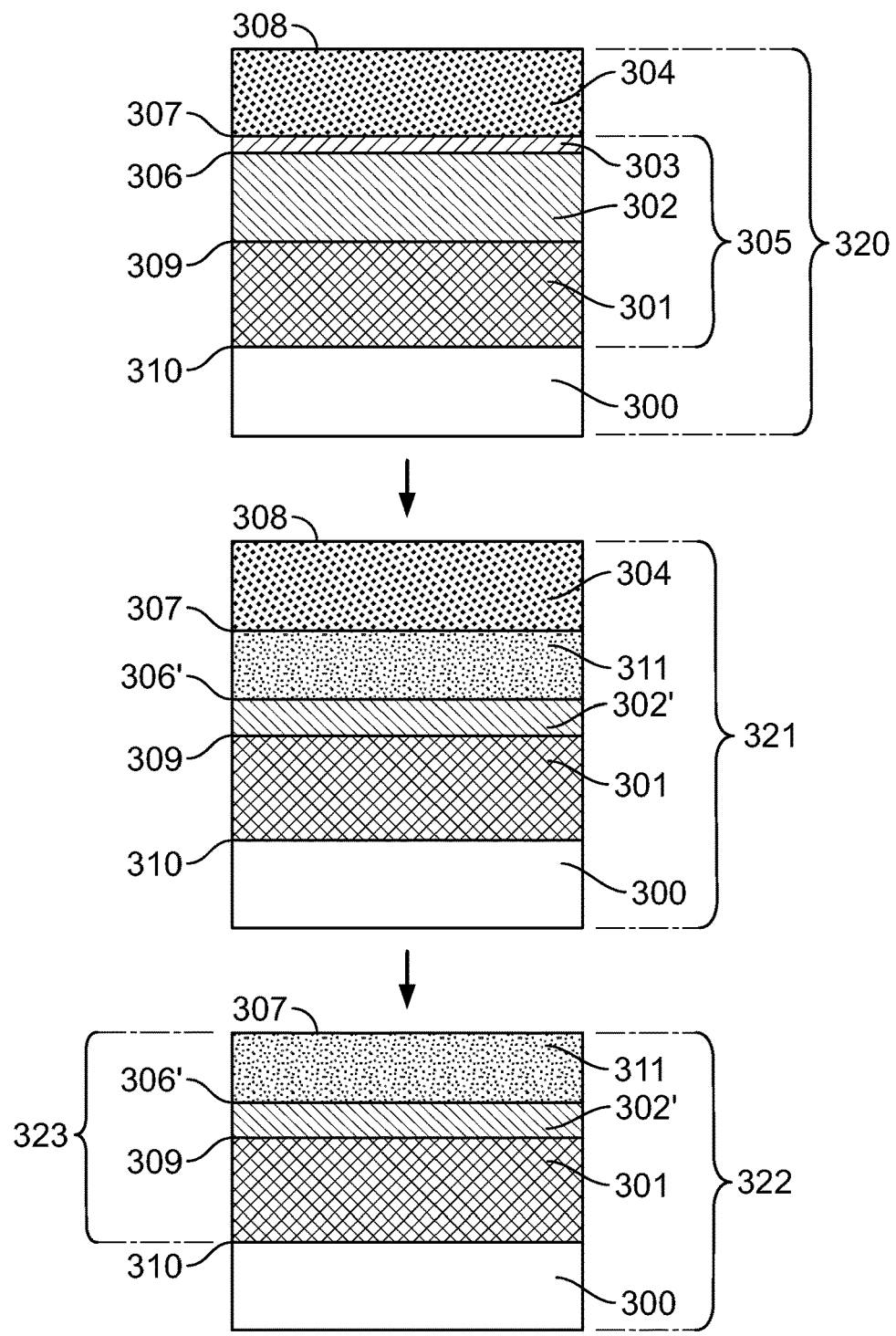
FIG. 3 showing a third example of an embodiment of the invention.

FIGS. 1 to 3 use similar reference signs for identical elements or elements playing a similar role. Thus, for example, element 108 on FIG. 1 is substantially identical or plays the same role as elements 208 and 308 on FIGS. 2 and 3, respectively.

FIG. 1 is an embodiment of a process for coating a base substrate 100 having at least one free surface 110, onto which is deposited a series of layers in order to form a coating or a plating for the substrate 100.

A first layer 101 of a first material other than that forming the substrate 100 is deposited on the free surface 110 of the base substrate 100. A second layer 102 of a second material, different from the materials forming the substrate 100 and the first layer 101, is in its turn deposited on the surface 109 of the first layer 101. A third layer 103 of a third material is then deposited on the surface 106 of the second layer 102, the material forming the third layer 103 being in its turn different from the materials used respectively for the substrate 100, the first layer 101 and the second layer 102. The three layers 101, 102, 103 deposited on the free surface 110 of the substrate 100 thus form a multilayer structure 105.

In an embodiment of FIG. 1, a fourth layer 104 is deposited on an outer surface 107 of the third layer 103. The material of the fourth layer 104 is so selected as to avoid the oxidation at least of the outer surface 107 of the third layer 103. The resulting structure 120, before reflow, therefore comprises the substrate 100, the multilayer structure 105 and a protective layer 104 as described above. Finally the exposed surface 108 of the fourth layer 104 of the structure 120 is subjected to a thermal treatment so as to perform a reflow of at least a part of the third layer 103 and of the second layer 102.

In an embodiment of FIG. 1, one of ordinary skill in the art would appreciate that the selection of different materials is permitted to optimise control of the reflow and of the final product. Thus, it is possible to select the material of the fourth layer 104, the protective layer against oxidation, so that the fourth layer 104 does not mix with any of the layers 101, 102, and 103 of the multilayer structure 105 during reflow. One of ordinary skill in the art would also appreciate that the fourth material may be selected having a specific heat 2 to 3 times higher than that of the second and third materials forming the second layer 102 and the third layer 103 respectively. Thus the fourth layer 104 can adequately conduct heat towards the outer surface 107 of the third layer 103 in order to perform an at least partial, or even total, reflow of the third layer 103.

In the embodiment of FIG. 1, other modifications of the invention are possible, such as the selection of the material of the third layer 103 with the lowest melting point of the melting points of the first, second and third materials forming the first 101, second 102 and third 103 layers respectively. This embodiment can be combined with a second layer 102, the material of which has a melting temperature 1.5 to 3 times greater than that of the material of the third layer 103.

Similarly, the substrate 100 and/or the material of the first layer 101 can be selected with a respective melting temperature at least 2 to 3 times higher than the melting temperature of the material of the second layer 102. The temperature of the reflow step can then be optimised depending on the selection of the materials of the first 101, second 102 and third 103 layers, as well as of the material of the protective layer 104. In an exemplary embodiment of a process for coating the substrate 100 shown in FIG. 1, it is advantageous to select a reflow temperature 1.5 to 3 times higher than the melting temperature of the material of the third layer 103, 0.8 to 1.5 times higher than the melting temperature of the material of the second layer 102, and less than or equal to the melting temperature of the material of the first layer 101 and/or of the substrate 100.

In an embodiment of FIG. 2, a structure 220 is obtained by a process according to the embodiment of FIG. 1. The structure 220 is therefore in every point analogous to the structure 120. In particular, the structure 220 includes a substrate 200, a first layer 201, a second layer 202 and a third layer 203, corresponding respectively to the substrate 100 and to the layers 101, 102, 103 of the embodiment of FIG. 1. The three layers 201, 202, 203 form a multilayer structure 205 similar to the structure 105 shown in FIG. 1, and on which is deposited a protective layer 204 analogous to the layer 104 of the first example of an embodiment. The description of the process up to obtaining the structure 220 will therefore be omitted and reference should be made to the description of FIG. 1 for more detail.

In an embodiment of FIG. 3, a structure 320 is obtained by a process according to the embodiment of FIG. 1. The structure 320 is therefore in every point analogous to the structures 120, 220. In particular, the structure 320 comprises a substrate 300, a first layer 301, a second layer 302 and a third layer 303, corresponding respectively to the substrate 100 and to the layers 101, 102, 103 of the example shown in FIG. 1, and to the substrate 200 and to the layers 201, 202, 203 of the example shown in FIG. 2. The three layers 301, 302, 303 form a multilayer structure 305 similar to the structures 105, 205 shown in FIGS. 1 and 2, and on which is deposited a protective layer 304 analogous to the layers 104, 204 of the two first examples of embodiments. The description of the process up to obtaining the structure 320 will therefore be omitted and reference should be made back to FIG. 1 for more detail.

In the embodiments of FIGS. 2 and 3, the coating process shown in FIG. 1 is applied to the coating of press-fit contact terminals for printed circuits. The substrates 200, 300 are made of copper, a material of which the melting temperature is approximately 1085° C. In an embodiment, the contacts are formed from materials other than copper, such as stainless steel or aluminium. The thickness of the substrates 200, 300 is variable, but for press-fit contact terminals for printed circuits, the thickness of the copper to be plated is generally less than 1 mm. In an embodiment, the thickness of the copper is approximately 0.64 mm.

In an embodiment, the materials of the respective first, second and third layers 201, 202, 203 and 301, 302, 303 of structures 220, 320 before reflow, such as shown in FIGS. 2 and 3, are metallic materials, particularly elementary metals, as opposed to alloys. In an embodiment, the first layer 201, 301 is made of nickel, the second layer 202, 302 is made of zinc, and the third layer 203, 303 is made of tin. The thickness of the first layer 201, 301 in the embodiments of FIGS. 2 and 3 is between 0.05 μm and 5 μm.

In an embodiment, the thickness of the first layer 201, 301, the layer of nickel, is particularly approximately 1.3 μm. The thickness of the second layer 202, 302, the layer of zinc, is within the range from 0.05 μm to 5 μm. The thickness of the third layer 203, 303, the layer of tin, is within the range from 0.05 μm to 2.5 μm.

The melting temperatures of nickel, approximately 1455° C., of zinc, approximately 420 C, and of tin, approximately 232° C., are therefore such that the respective first, second and third layers 201, 202, 203 and 301, 302, 303 display the properties permitting optimisation of the control of the reflow step such as described in relation to the embodiment of FIG. 1. Thus in the embodiments of FIGS. 2 and 3, the material of the third layer 203, 303, (tin) is that having the lowest melting point. The material of the second layer 202, 302, (zinc) has a melting temperature 1.5 to 3 times greater than that of the tin forming the third layer 203, 303. Similarly, the material of the substrate 200, 300, (copper) and the material of the first layer 201, 301 (nickel) have a respective melting temperature at least 2 to 3 times higher than the melting temperature of the material of the second layer 202, 302 (zinc).

In the embodiments of FIGS. 2 and 3, the protective layer 204, 304 of the structures 220, 320 is a mixture of graphite powder and microcrystalline active carbon. Graphite has a specific heat of approximately 0.71 J·g−1·K−1, while that of tin is approximately 0.227 J·g−1·K−1, that of zinc is approximately 0.388 J·g−1·K−1, and that of nickel is approximately 0.444 J·g−1·K−1. The specific heat of the material of the protective layer 204, 304 is therefore selected from 2 to 3 times higher than that of the materials of the three respective layers 201, 202, 203 and 301, 302, 303 forming the multilayer structures 205, 305 of the structures 220, 320. A mixture of 80% to 95% of graphite and the remainder of monocrystalline active carbon, particularly of 90% graphite and 10% monocrystalline active carbon, provides protection against oxidation and of conduction of heat from the protective layer 204, 304 during the step of reflow of the multilayer structures 205, 305 described above in for the embodiments of FIGS. 2 and 3.

In the embodiments of FIGS. 2 and 3, the temperature of the reflow step has been optimised depending on the selection of the materials of the first 201, 301, second 202, 302 and third 203, 303 respective layers, as well as of the material of the protective layer 204, 304. In both embodiments, a temperature is applied from 1.5 to 3 times higher than the melting temperature of tin, the material of the third layer 203, 303, from 0.8 to 1.5 times higher than the melting temperature of the zinc material, the material of the second layer 202, 302, and less than or equal to the melting temperature of nickel, the material of the first layer 201, 301 and of copper, the material of the substrate 200, 300 to be plated. Moreover, a continuous reflow process permits shorter treatment durations than those known conventionally for the deposited thicknesses and the selected applied temperatures. Thus, a temperature of at least 350° C., particularly within the range from 350° C. to 600° C., more particularly within the range from 380° C. to 580° C., and still more particularly from 400° C. to 550° C., permitted improved reflow by permitting a duration of the reflow step between 1 and 15 seconds approximately, particularly between 2 seconds and 10 seconds, and more particularly between 3 seconds and 7 seconds.

Depending on the thicknesses of tin and zinc deposited respectively for the third layer 203, 303 and the second layer 202, 302, in other words the mass composition of each of them in the final reflowed alloy 211, 311, the melting temperature of the alloy varies according to a phase diagram. The larger the proportion of zinc, the higher the melting temperature will have to be in order to reflow all of the layers of tin 203, 303 and of zinc 202, 302 deposited. The converse applies to cases having a smaller the proportion of zinc. Moreover, the use in two superimposed layers 202, 302 and 203, 303 of two alloys with a low melting point, such as tin 232° C. and zinc 420° C., having a eutectic in this case at 8.9% of zinc, provides at their interface 206, 306 the lowest melting temperature of the proposed system, or in the embodiments shown in FIGS. 2 and 3, approximately 200° C. Management of the different thicknesses deposited then gives the possibility of completely reflowing or not reflowing the sub-layer 202, 302 of zinc.

In an embodiment of FIG. 2, the starting mass composition comprises from 85% to 95% of tin for 5% to 15% of zinc. In another embodiment, the starting mass composition is 90% of tin for 10% of zinc. The thickness of the layer of zinc 202 is approximately 0.1 µm in an embodiment, and the thickness of the tin layer 203 can be for example approximately 0.5 µm in an embodiment. The melting temperature of the interface 206 between the layer of zinc 202 and the layer of tin 203 is, after rapid diffusion of the zinc, approximately 198° C., and corresponds to the melting temperature of the binary eutectic Sn (91.1%)-Zn (8.9%). The melting temperature of the alloy Sn(90%)-Zn(10%), as a whole, is around 200° C. The reflow temperature is selected at 550° C. and is applied continuously for a duration of approximately 3 seconds so that complete reflow, from the two fronts or interfaces 206 and 207, of the layers of tin 203 and of zinc 202 is affected. There therefore remains no buffer layer of the starting layer of zinc 202.

The initial layer of nickel 201, which forms a diffusion barrier to prevent the diffusion of the copper from the substrate 200 towards the more outer layers 202, 203, is partially dissolved to form a third alloy element with the tin and the zinc, thus forming a multiphase, also known as polyphase, solidification structure 211, after reflow, comprising an intermetallic tin-zinc-nickel compound. The remainder 201' of the starting layer of nickel 201 continues to form a diffusion barrier relative to the substrate 200. The protective layer 204 made of a mixture of graphite and active carbon does not mix with the other layers during reflow and avoids oxidation particularly of the surface 207 of the third layer 203 as well as of the subjacent layers 202, 201, 200.

In the embodiment of FIG. 2, a step of removal of the protective layer 204 once the desired final alloy 211 has been obtained. The protective layer 204 was a mixture of graphite and active carbon, it is sufficient to tap, or even to simply blow, on the structure 221 after reflow to cause crumbling or breaking of the protective layer 204, which is less resistant to shocks than the alloy 211 and the barrier layer 201' forming the final coating of the substrate 200. The final product 222 is therefore composed of the substrate 200 plated with a coating 223 composed of the remainder of the barrier layer 201 and of the multiphase alloy 211. It has been found that the coating 223, particularly the multiphase alloy 211, thus created has thixotropic properties, of which advantage can be taken in the context of plating of the terminals of press-fit contacts.

In an embodiment, the alloy 223 is created comprising a polyphase structure 211 similar to that described in relation to the embodiment of FIG. 2, particularly having the same type of thixotropic properties. Thus, in an embodiment, the starting mass composition is from 69% to 79% of tin for 21% to 31% of zinc. In another embodiment, the starting mass composition is approximately 74% of tin for 26% of zinc. The respective thicknesses of the layers of zinc 202 and of tin 203 can then be for example approximately 0.4 µm and 0.15 µm respectively. A temperature of approximately 500° C. can then be applied continuously for a duration of approximately 5 seconds.

In an embodiment of FIG. 3, the starting mass composition is from 5% to 15% of tin for 85% to 95% of zinc. In another embodiment the starting mass composition is approximately 10% of tin for 90% of zinc. The respective thickness of the layers of zinc 302 and of tin 303 can be of the order of 0.5 µm. The melting temperature of the interface 306 between the layer of zinc 302 and the layer of tin 303 is, after rapid diffusion of the zinc, approximately 198° C., and corresponds to the melting temperature of the binary eutectic Sn(91.1%)-Zn(8.9%). The melting temperature of the alloy Sn(10%)-Zn(90%), as a whole, is around 400° C. The reflow temperature is selected at approximately 500° C. and is applied continuously for a duration of approximately 3 seconds so that the entire layer of tin 303 is completely reflowed, from the two fronts or interfaces 306 and 307. The layer of zinc 302 is only partially reflowed, thus forming the tin-zinc multiphase layer 311 resting on a buffer layer 302' of zinc, corresponding to the remaining portion of the starting layer of zinc 302.

In contrast to the embodiment of FIG. 2, in an embodiment of FIG. 3 the diffusion barrier layer of nickel 301 is not reflowed. Depending on the duration and temperature of the thermal treatment, it is possible to obtain different structures of the material for the layer 311 than that of the embodiment of FIG. 2. For the example, the layer 311 is a biphase solidification structure formed of globular zinc surrounded by tin with a small diffusion zone between these two reflowed elements. However variations of +10° C. to +30° C. relative to the initially selected temperature can produce the same type of layers 311, 302' but with different properties for a same initial mass composition. Thus, with greater diffusion, it is possible to obtain a eutectic structure with pro-eutectic precipitation of zinc, of acicular form. A still greater increase in temperature, for example of +50° C., can bring about the total reflowing of the sub-layer of zinc 302 instead of leaving the buffer layer 302'. As for the embodiment of FIG. 2, the protective layer 304 made of a mixture of graphite and active carbon does not mix with the other layers during reflow, and avoids oxidation particularly of the surface 307 of the third layer 303, as well as of the subjacent layers 302, 301, 300 during the treatment.

Similar to the embodiment of FIG. 2, an embodiment of FIG. 3 also comprises the removal of the protective layer 304 from the structure 321 once the desired final alloy 311 has been obtained following the thermal treatment of the structure 320. This step is similar to that described for the layer 204 shown in FIG. 2. Reference should therefore be made back to the preceding description. Similar to the embodiment of FIG. 2, in the embodiment of FIG. 3, the coating 323, particularly the multiphase layer 311, of the final product 322 has thixotropic properties, which improve the insertion process of press-fit contacts in printed circuit boards.

In an embodiment, the starting mass composition of the layers deposited and by adjusting the temperature and the duration of the reflow step is varied from that of the embodiment of FIG. 2. Depending on the composition selected, the modifications can lead to the same type of tin-zinc biphase structure 311 having the same type of properties, particularly thixotropic properties, resting if necessary on a larger or smaller buffer layer 302' of zinc depending on the quantity of zinc reflowed.

Thus, in an exemplary embodiment, a mass composition is used comprising from 42% to 52% of tin for 48% to 58% of zinc. In another embodiment, a mass compositioned is used comprising approximately 47% of tin for 53% of zinc. The respective thicknesses of the layers of zinc 302 and of tin 303 may be approximately 0.6 μm and 0.7 μm respectively. A reflow step performed at a temperature of approximately 400° C. applied continuously for a duration of approximately 7 seconds results in a globular biphase tin-zinc structure 311 resting on a buffer layer 302' of zinc of reduced thickness relative to the initial layer of zinc 302.

In an embodiment, a mass composition is used comprising from 18% to 28% of tin for 72% to 82% of zinc. In another embodiment, a mass composition is used comprising approximately 23% of tin for 77% of zinc. In an embodiment, the respective thicknesses of the layers of zinc 302 and of tin 303 are approximately 0.25 μm and 0.85 μm respectively. A reflow step performed at a temperature of approximately 460° C. applied continuously for a duration of approximately 5 seconds this time results in a globulo-acicular biphase tin-zinc structure 311 resting on a buffer layer 302' of zinc of reduced thickness relative to the initial layer of zinc 302.

A finish of binary eutectic type with pro-eutectic zinc, or tin and globular zinc, like the layer 311 of the embodiment of FIG. 3, will be favourable to the formation of cold weld on a circuit of tinned finish. During the press insertion of the contact, represented by the substrate 300, in the hole of the printed circuit, the pressure contacting of the tin of the coating of the circuit with the pro-eutectic zinc 311 of the contact 300 will permit the formation of the tin-zinc binary eutectic. The melting point of the tin-zinc eutectic is lower than that of the two elements placed in contact, leading to the melting of the interface and the formation of micro-welds between the contact 300 and the circuit.

In an embodiment, the process described in relation to FIG. 1 may also be applied to silver-plated printed circuits rather than to copper circuits. For a same solidification structure 211, 311, a silver-plated printed circuit will not have the same ability to form micro-welds. The silver-plated circuit does not form a eutectic with the zinc and the melting temperature of the tin-silver eutectic is approximately 221° C., or very close to that of pure tin. The use of the process described in the present invention allows for the use of alloy elements such as antimony, forming with 44% by mass a eutectic with a melting point of approximately 485° C. with silver. In the silver-plated circuit embodiment, the zinc layer 202, 302 is replaced with antimony as a sub-layer in order to allow, after reflow, the formation of the globular islets of antimony favourable to micro-welds with the silver of the circuit. This structure also contributes to the structural conditions for stopping the formation of filaments to be satisfied.

The internal stresses created from the operations of shaping the contact 200, 300 by die-stamping will be partially relaxed during reflow. From this results another advantage of the solidification structure 211, 311 and the solidification process, is that the presence of globular zinc or acicular pro-eutectic zinc permits, by formation of a eutectic with a low melting point, a cold micro-weld effect between the structures 211, 311 and the surface alloy of a printed circuit. As a result, the forces for extracting a press-fit contact 200, 300 from a tinned circuit are greater than the insertion forces, which improves the holding in place of the press-fit contacts 200, 300.

The invention therefore permits the creation of a surface 207, 307 without filaments, and by preventing such formation, the surface 207,307 can be used for coatings of terminals of press-fit contacts 200, 300. The solidification structures 211, 311 and their above described embodiments are obtained at high temperature by the inventive process, and consist of several phases, elements, more or less stable precipitates, and gradients of concentration in the thickness, with the grains and inter-granulars opposing movements of dislocations in the outermost layer of the coating. Such structure 211,311 provide the advantage of slowing, or even preventing, diffusion phenomena which generate filaments. Further, the inventive process permits control of the fineness, the distribution and the quantity of the precipitates and phases formed. Another advantage of the process, depending on the embodiment of the solidification structure 211, 311 selected and the thicknesses deposited, is the avoidance of dewetting of the fused alloy.

In an embodiment where the third layer 103, 203, 303 is made of tin, a layer 102, 202, 302 of zinc can be used as a coating sub-layer 102, 202, 302 and can be reflowed with the layer of tin 103, 203, and 303. It is therefore possible to perform the reflow of the layers of tin 103, 203, and 303 and of zinc 102, 202, 302 into a tin-zinc multilayer coating 211, 311. Such tin-zinc multilayer coatings 211,311 are produced by thermal contact at high temperature on a protective layer 104, 204, 304, of which provides protection against oxidation through the mixture of graphite described above. It is possible to initiate the reflowing in a selective manner at the tin-zinc interface 106, 206, 306, while reflowing the outer surface 107, 207, 307 of the layer of tin 103, 203, 303 before solid-solid diffusion towards the outer surface of the coating. In this manner it is possible to create a non-porous, smooth and hard surface 211, 311 for use as the coating of base substrates 100, 200, 300, such as electronic contacts.

A residual buffer sub-layer of zinc 302' is controllable to have a multiphase solidification structure 211, 311 comprising precipitates which block the movement of dislocations, to partially or totally relax the stresses present in the substrate 100, 200, 300 and in the coating layers 211, 311.

Another advantage of the above-described processes is that the process is both quicker than known processes, and may be performed at a lower cost. For example, the sub-layer 101, 201, 201', 301 of nickel can be used and partially mixed with the liquid tin-zinc alloy 211 in order to create a surface without filaments with advantageous properties with respect to corrosion. In an embodiment having the tin-zinc mixture and/or of the sub-layer 101, 201, 301 of nickel, the alloy 211, 311 created has more advantageous thermal properties than a conventional alloy of pure tin. Therefore an alloy 211, 311 having thixotropic properties is obtainable that facilitates and improves the insertion of the press-fit contacts into receiving holes positioned on the printed circuit board. The alloy 211,311 prevents degradation under the generated insertion stresses, while retaining the advantageous properties of the final product with regard to the prevention of filaments. The coefficient of friction and the mechanical and thermal properties of the surfaces 207, 307 thus obtained are improved relative to conventional tin coatings.

Through the above described embodiments, coatings 211, 311 without filaments are obtained which prevent the subsequent formation of filaments, particularly tin filaments. The obtained coatings 211,311 are therefore usable for both the plating of pin terminals of press-fit contacts, and also for the receiving holes of the printed circuit board, for the platings of the printed circuits themselves, or more broadly for any product vulnerable to filaments. Moreover, the use of the inventive process to plate printed circuit elements, and the use of the inventive coating for plating of press-fit contacts, advantageously permits relaxation of the internal stresses and stabilisation of the metallurgical structure of the plated elements and of their coating. Particularly, the insertion forces of press-fit contacts in corresponding receiving holes of printed circuits are stabilised during the lifetime of the product.

What is claimed is:

1. A process for coating a substrate comprising the steps of:
    providing a substrate having at least one free surface;
    depositing a first layer of a first material on the free surface of the substrate;
    depositing a second layer of a second material, different from the first material, on the first layer;
    depositing a third layer of a third material, different from the first and second materials, on the second layer;
    depositing a protective layer of a fourth material, different and separate from the first, second and third materials, on the third layer, the protective layer is an outermost layer deposited on the substrate, the fourth material of the protective layer consists of graphite powder and microcrystalline active carbon; and
    performing a reflow of at least the second and third layers from the first, second, and third layers, by transfer of heat through the thermal contact on the protective layer, such that the fourth material of the protective layer does not melt or mix with the first, second, and third layers during reflow and the protective layer prevents oxidation of at least the third layer.

2. The process of claim 1, wherein a temperature of the reflow is 1.5 to 3 times higher than the melting temperature of the third material.

3. The process of claim 1, wherein the temperature of the reflow is 0.8 to 1.5 times higher than the melting temperature of the second material.

4. The process of claim 1, wherein the temperature of the reflow is less than or equal to the melting temperature of the first material or the substrate.

5. The process of claim 1, wherein the fourth material is a mixture of 80% to 95% of graphite and the remainder of microcrystalline active carbon.

6. The process of claim 1, wherein the fourth material is a mixture of 90% of graphite and of 10% of microcrystalline active carbon.

7. The process of claim 1, wherein the first, second, and third materials include elementary metals.

8. The process of claim 1, wherein the third material has a melting point lower than a melting point of the first and second materials.

9. The process of claim 1, wherein the second material has a melting temperature 1.5 to 3 times greater than a melting temperature of the third material.

10. The process of claim 1, wherein the substrate and the first material each have a melting temperature at least 2 to 3 times higher than a melting temperature of the second material.

11. The process of claim 1, wherein the fourth material has a specific heat 2 to 3 times higher than a specific heat of the second and third materials.

12. The process of claim 1, wherein the first material includes nickel.

13. The process of claim 1, wherein the second material includes zinc or antimony.

14. The process of claim 1, wherein the third material includes tin or silver.

15. The process of claim 1, wherein a temperature of the reflow is at least 350° C.

16. The process of claim 1, wherein a temperature of the reflow is in a range from 350° C. to 600° C.

17. The process of claim 1, wherein a temperature of the reflow is in a range from 380° C. to 580° C.

18. The process of claim 1, wherein a temperature of the reflow is in a range from 400° C. to 550° C.

19. The process of claim 1, wherein a duration of the reflow is between 1 second and 15 seconds.

20. The process of claim 1, wherein a duration of the reflow is between 2 seconds and 10 seconds.

21. The process of claim 1, wherein a duration of the reflow is between 3 seconds and 7 seconds.

22. The process of claim 1, wherein a thickness of the first layer is 0.05 µm to 5 µm; a thickness of the second layer is 0.05 µm to 5 µm; or a thickness of the third layer is 0.05 µm to 2.5 µm.

23. The process claim 1, further comprising a removal of the protective layer after the reflow step.

24. A process for coating a press-fit contact pin comprising the steps of:
provide a substrate having at least one free surface;
depositing a first layer of a first material on the free surface of the substrate;
depositing a second layer of a second material, different from the first material, on the first layer;
depositing a third layer of a third material, different from the first and second materials, on the second layer;
depositing a protective layer of a fourth material, different and separate from the first, second and third materials, on the third layer, the protective layer is an outermost layer coated on the substrate, the fourth material of the protective layer consists of graphite powder and microcrystalline active carbon; and
performing a reflow of at least the second and third layers from the first, second, and third layers, by transfer of heat through the thermal contact on the protective layer, such that the fourth material of the protective layer does not melt or mix with the first, second, and third layers during reflow and the protective layer prevents oxidation of at least the third layer.

25. A process for coating an element positioned on a printed circuit board, comprising the steps of:
providing a printed-circuit board substrate having at least one free surface;
depositing a first layer of a first material on the free surface of the substrate;
depositing a second layer of a second material, different from the first material, on the first layer;
depositing a third layer of a third material, different from the first and second materials, on the second layer;
depositing a protective layer of a fourth material, different and separate from the first, second and third materials, on the third layer, the protective layer is an outermost layer coated on the substrate, the fourth material of the protective layer consists of graphite powder and microcrystalline active carbon; and
performing a reflow of at least the second and third layers from the first, second, and third layers, by transfer of heat through the thermal contact on the protective layer, such that the fourth material of the protective layer does not melt or mix with the first, second, and third layers during reflow and the protective layer prevents oxidation of at least the third layer.

\* \* \* \* \*